United States Patent [19]
Campbell et al.

[11] Patent Number: 5,519,338
[45] Date of Patent: May 21, 1996

[54] CONTROLLED SLEW RATE OUTPUT BUFFER

[75] Inventors: John G. Campbell, Los Altos; Ban P. Wong, Milpitas, both of Calif.

[73] Assignee: MicroUnity Systems Engineering, Inc., Sunnyvale, Calif.

[21] Appl. No.: 305,650

[22] Filed: Sep. 14, 1994

[51] Int. Cl.$^6$ .......................... H03K 19/02; H03K 17/16
[52] U.S. Cl. ...................... 326/27; 326/87; 326/85
[58] Field of Search .................................. 326/83, 84, 65, 326/87, 27, 21, 16

[56] References Cited

U.S. PATENT DOCUMENTS

| | | | |
|---|---|---|---|
| 4,902,914 | 2/1990 | Masuoka | 326/26 |
| 5,059,821 | 10/1991 | Murabayashi et al. | 326/84 |
| 5,216,293 | 6/1993 | Sei et al. | 307/443 |
| 5,218,239 | 6/1993 | Boomer | 326/27 |
| 5,243,237 | 9/1993 | Khieu | 326/84 |

*Primary Examiner*—Edward P. Westin
*Assistant Examiner*—Richard Roseen
*Attorney, Agent, or Firm*—Burns, Doane, Swecker & Mathis

[57] ABSTRACT

An output buffer that controls the slew rate of its output signal is disclosed. The buffer includes a pull-up and a pull-down bipolar transistor coupled at a common output node in series between VDD and VSS. The buffer also includes a first set of parallel MOS devices coupled between the common output node and the base of the pull-down bipolar transistor. A second set of parallel MOS devices are coupled between the base of the pull-up output stage bipolar transistor and VDD. The gates of each set of MOS devices are coupled to a digital select signal. The amount of current driving the base of each of the pull-up and pull-down transistors (when they are enabled) is determined by the number of MOS devices enabled by the digital select signal. Thus, the buffer of the present invention is able to adjust the slew rate of its output signal to accommodate different loads coupled to the common output node.

16 Claims, 6 Drawing Sheets

CONTROLLED SLEW RATE OUTPUT BUFFER

FIELD OF THE INVENTION

The present invention relates to the field of digital circuit designs and particularly to the slew rate of digital output signals.

BACKGROUND OF THE INVENTION

Multiple pin logic devices are commonly inserted into printed circuit (PC) boards so that they may be coupled to other logic devices and components to create a larger digital system. The devices and components are interconnected with a conductive line pattern that is printed onto the PC board. For each unique system design, a different number of devices may be coupled to each pin of the logic device. As a result, a circuit designer often times is unable to know the amount of capacitive loading on each pin of a logic device.

The amount of capacitive loading on an I/O pin affects the rate at which the output signal transitions. Additionally, in the case when the frequency of the output signal is high and the capacitive loading on the I/O pin is large, the output signal may overshoot the target digital high or low voltage levels. In a logic system, overshoot problems may cause many types of errors, such as erroneous clocking signals, misread data, ground bounce, positive power supply droop, and even latch-up on the I/O pins internal output circuitry or on subsequent logic stages coupled to the I/O pin.

One manner in which designers have attempted to eliminate this overshoot problem is to design logic circuits with I/O buffers having controlled slew rate output signals. One such prior art buffer design, specifically designed for eliminating overshoot problems during high-to-low output transitions, includes a PMOS pull-up device and an NMOS pull-down device. The gate of the NMOS pull-down device is coupled to a CMOS inverter that is coupled in series with a constant current source (typically the current source is an MOS device that is biased into saturation by an appropriate voltage). When the input signal to the CMOS inverter transitions high-to-low, the current source is coupled to the gate of the pull-down NMOS device (through the PMOS portion of the inverter) and charges the gate capacitance of the NMOS pull-down device with a constant current. As a result, the gate voltage on the pull-down NMOS device rises to a high voltage at a slew rate controlled by the current source while the output node correspondingly discharges at the same rate. A similar prior art design is also utilized to control the low-to-high output signal slew rate of an I/O buffer.

There are several problems associated with the above described buffer. First, the gate voltage of the pull-down NMOS device and consequently, the output voltage are not truly linear because the current source's saturation drain current and its gate-to-source voltage are not linearly related. Specifically, the saturated drain current is proportional to the gate-to-source voltage squared ($I_D$ is proportional to $V_{GS}^2$). As a result, the slew rate of the voltage signal on the gate of the pull-down MOS device and the output node is not linear and does not perform in a digital signal-like manner. Secondly, this buffer has an associated problem with Miller feedback capacitance, also causing non-linearity in the output signal. In addition, the current source and its associated bias voltage set the slew rate of the output signal. Consequently, the above described prior art buffer design is only effective with a specific capacitive load. To change the slew rate for a given load (or to change the load while keeping the slew rate constant), either the bias voltage or size of the current source MOS device needs to be changed which may involve IC mask changes.

Another prior art buffer designed to control the slew rate of the output voltage of a device's I/O pin replaces the NMOS pull-down device of an output buffer with a number of successively sized parallel NMOS pull-down devices. The devices are connected in a serpentine arrangement such that the devices turn-on in sequence resulting in a graded turn-on. This graded turn-on effect is due to the resistance of the serpentine interconnect line connecting all of the gates of the parallel NMOS pull-down devices and the corresponding graded voltage drops along that interconnect line. In effect, as the voltage on the serpentine interconnect line increases each of the parallel NMOS pull-down devices are successively turned on, thus controlling the slew rate of the output high-to-low transition. This buffer design also includes a mechanism to turn off all of the parallel NMOS devices quickly when the output node needs to transition high again. The turn-off mechanism includes small NMOS devices coupled to the gates of each of the parallel NMOS pull-down devices. The turn-off transistors are all turned on at once so as to turn off all of the parallel NMOS pull-down devices, quickly decoupling them from the output node. In this way, the NMOS pull-down devices are all turned off when all of the turn-off devices are simultaneously turned on. The turn-off mechanism avoids the condition in which both the pull-down and pull-up devices are on simultaneously and a short circuit current occurs between the two power supplies VDD and GND.

As with the previous prior art embodiment, this buffer is limited to providing a given slew rate for a specific capacitive load (unless major mask or design changes are made). In addition, this type of technique is not effective with silicide gate technology due to the low gate resistance characteristics of this process.

The present invention is a low power BiCMOS buffer that provides an output signal having a digitally controlled slew rate. Thus, the slew rate of the output signal may be adjusted, depending on the I/O pins load capacitance and inductance.

SUMMARY OF THE INVENTION

The present invention is a BiCMOS output buffer having a digitally controlled slew rate output signal. The buffer facilitates digitally controlling the slew rate of the device's output signal by providing a variable drive current to NPN pull-up and pull-down transistors. In this way drive current may be selected depending on the load capacitance and inductance.

A first embodiment is designed to be compatible with logic that utilizes a 3.30 volt power supply and utilizes MOS devices that are fabricated to operate with voltages no more than 3.30 volts±0.30 volts. In this embodiment, drive current is supplied to the pull-up output NPN transistor by coupling binary coded sized parallel PMOS devices between the base of the pull-up device and the most positive power supply. Drive current is supplied to the pull-down NPN transistor by coupling binary coded sized parallel NMOS devices between the base of the pull-down device and the output node. Any combination of the parallel PMOS or NMOS devices are enabled at one time by a digital input signal to provide the desired amount of drive current to their corresponding NPN pull-up or pull-down transistor.

Another feature of the buffer of the present invention is that it utilizes the charge stored in the output load capacitance to provide additional drive to the pull-down bipolar transistor in a way so as to minimize power consumption of the present invention's buffer design. In addition, since the buffer is designed with 3.3 volt CMOS logic it is an extremely power efficient design.

The second embodiment of the buffer of the present invention is compatible with logic that utilizes a 5.00 volt power supply and utilizes MOS devices that are fabricated to operate with voltages no more than 3.30 volts ±0.30 volts. In this design additional protective devices are included to ensure that source-to-drain, gate-to-drain, and gate-to-source bias voltages of the 3.30 volt devices do not exceed 3.60 volts.

Current drive is supplied to the pull-down portion in the second embodiment in the same manner as the first embodiment. Specifically, binary coded sized parallel NMOS devices coupled between the base of the pull-down device and the output node provide a digitally controlled current drive. The current drive to the pull-up portion in the second embodiment is provided by two current mirror circuits. Either one or both current mirrors are enabled by the current select signal so as to supply the current drive to the pull-up NPN device.

DETAILED DESCRIPTION

In the following description, a BiCMOS buffer is described in which numerous specific details are set forth, such as specific voltage levels, device conductivity type etc., in order to provide a thorough understanding of the present invention. It will be obvious, however, to one skilled in the art that these specific details need not be employed to practice the present invention. In other instances, well-known structures and circuits have not been shown in detail in order to avoid unnecessarily obscuring the present invention.

Figure 1:
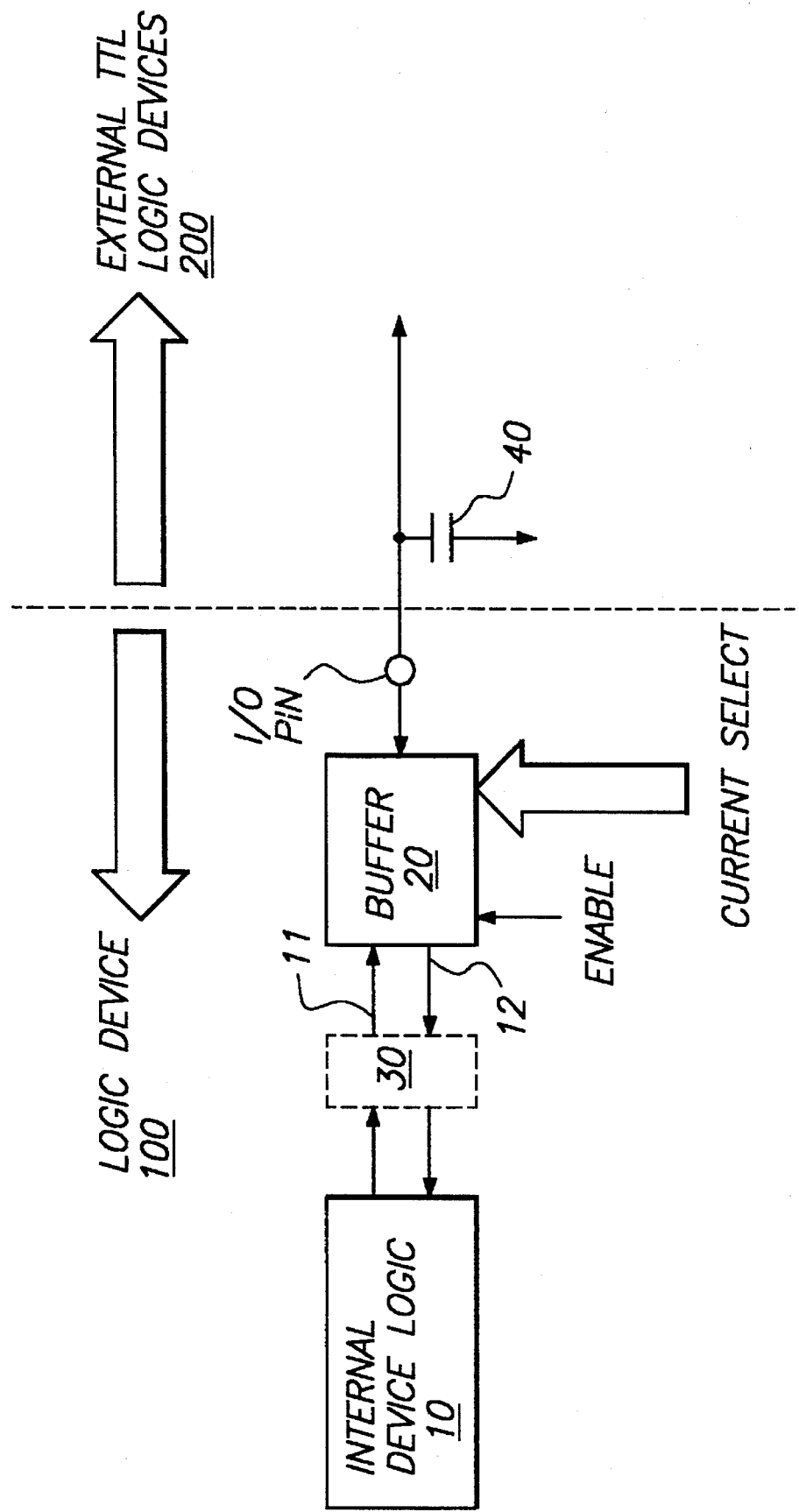
FIG. 1 is a block diagram of a logic chip with the buffer of the present invention interfacing with external logic devices.

FIG. 1 illustrates the connection between a logic device 100 and external transistor-transistor logic (TTL) devices 200 through the logic devices I/O pin. The logic device includes internal device logic 10, an optional level converter 30, and the buffer (20) of the present invention. Internal logic 10 outputs a digital signal that transitions between two voltage levels—each corresponding to a digital high or low logic level. The magnitude of each voltage level depends on the particular type of logic utilized to implement internal logic 10. For example, if internal logic 10 is implemented in emitter-coupled logic (ECL), a signal having a voltage swing ranging from VDD–800 mvolts to VDD–1.6 volts is generated.

Buffer 20 of the present invention is shown having an enable signal and a current select control signal bus. The enable signal is used to enable the buffer to transfer the data from internal logic 10 to external TTL logic devices 200. In addition the buffer may be disabled if data is to be transferred from the I/O pin to the internal logic. When buffer 20 is deselected, the output of the buffer is tri-stated.

The current select signal coupled to buffer 20 (FIG. 1) is an n-bit digital signal that controls the slew rate of buffer 20's output signal. This select signal is set depending on capacitive load 40 coupled to the I/O pin and the desired slew rate; (note: capacitive load 40 represents the input capacitive loading of external TTL devices 200 reflected back to the I/O pin of logic device 100). The select signal may be set statically or from a register depending on whether on-line control is desired.

It should be noted that in one embodiment, buffer 20 of the present invention is 3.30 volt CMOS compatible, i.e. only a digital signal that fluctuates between 0.00 volts to 3.30 volts may be coupled to its input. Thus, if the output signal generated by internal logic 10 is not 3.30 volt CMOS compatible, it needs to be converted. Level converter 30 is represented in dashed lines to indicated that it is necessary only when the digital signal generated by internal logic 10 is something other than a signal that is compatible with CMOS digital signal.

Figure 2:
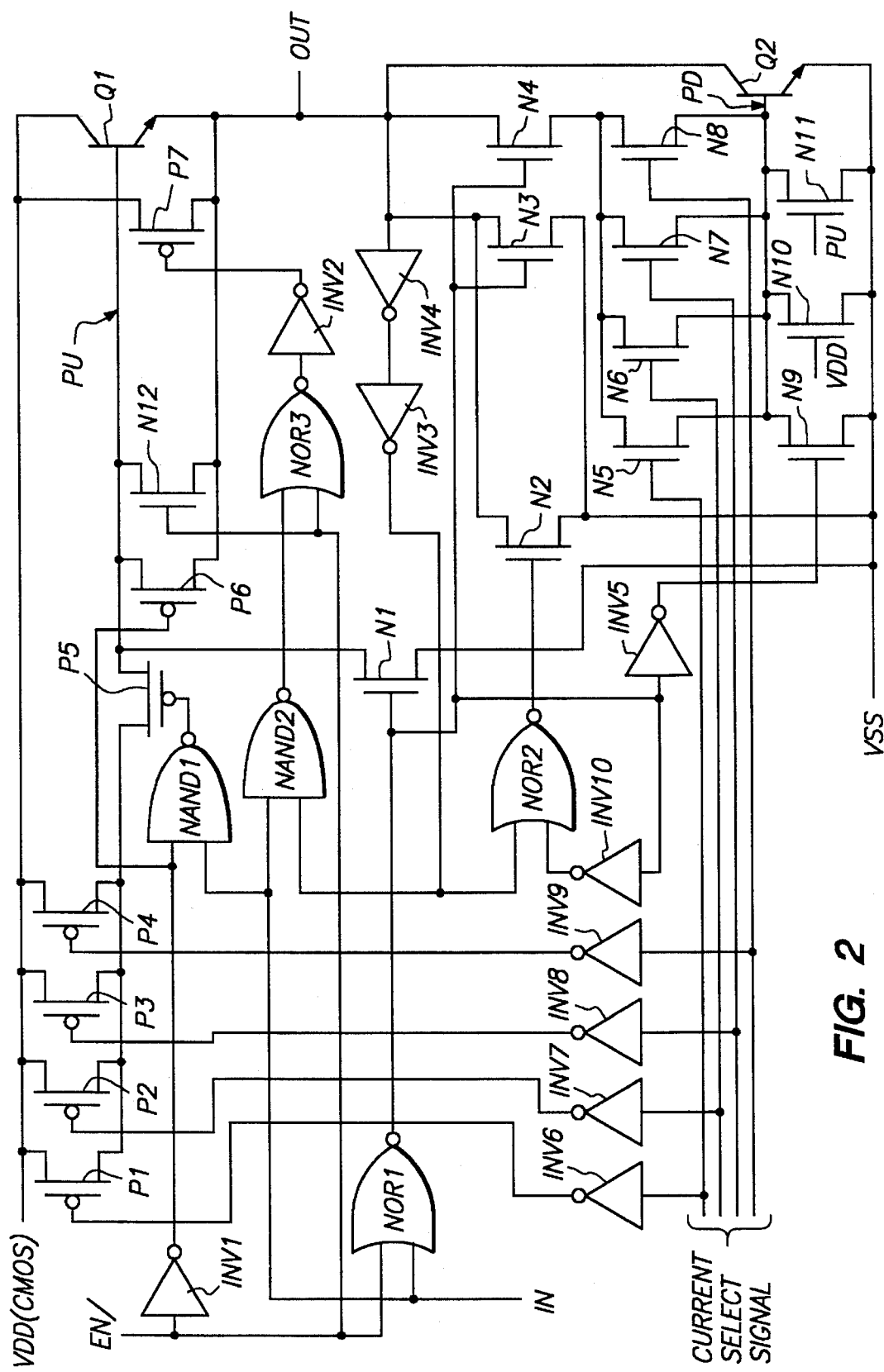
FIG. 2 illustrates the circuit schematic of a first embodiment of the buffer of the present invention compatible with 3.30 volt power supply logic.

FIG. 2 shows an embodiment of the BiCMOS buffer of the present invention that is designed to be compatible with logic that utilizes a 3.30 volt power supply and utilizes MOS devices that are fabricated to operate with voltages no more than 3.30 volts±0.30 volts. In this embodiment, VDD is nominally 3.30 volts and VSS is ground, or 0 volts. It is assumed that the input pin, IN, and output pin, OUT, of the buffer shown in FIG. 2 interfaces with logic that utilizes a VDD that does not exceed 3.60 volts.

Bipolar devices Q1 and Q2 are the pull-up and pull-down devices for the buffer, respectively. The base of Q1 is coupled to the PU (pull-up) drive line and the base of Q2 is coupled to the PD (pull-down) drive line. When OUT is being driven high, it is driven to a voltage equal to VDD. When OUT is being driven low, it is pulled to a voltage equal to VSS.

To enable the pull-up portion of the buffer, IN is set high and EN/ is set low. When this is true, both inputs of NAND1 are high and its output is low. As a result, P5 is enabled and couples drive devices P1–P4 to the PU drive line.

The amount of drive provided by devices P1–P4 is determined by the current select signal. The current select signal is inverted by inverters INV6– INV9 and coupled to the gates of devices P1–P4. The current select signal turns on either one, two, three or four devices at a time. For example, if the current select signal is "0001" then devices P1–P3 have their gates coupled to a voltage corresponding to a high CMOS logic level and device P4 has its gate coupled to a voltage corresponding to a low CMOS logic level. As a result, P1–P3 are off and P4 is on and supplying a current to the PU line. The amount of current provided by P4 depends on its size. If the current select signal is "0011", then devices P3 and P4 are both on and supplying current to the PU line. In the preferred embodiment, devices P1– P4 are variably sized in a binary ratio providing 15 levels of current drive to Q1. However, devices P1–P4 may be sized differently for other applications.

Devices P1–P4 (or any combination of the four devices) are able to drive Q1 so that OUT is pulled to a voltage equal to VDD minus one diode drop down, i.e. VDD–Vbe(Q1). To drive OUT all the way to VDD, a feedback loop including INV3, INV4, NAND2, NOR3, INV2 and PMOS device P7 is employed.

Figure 3:
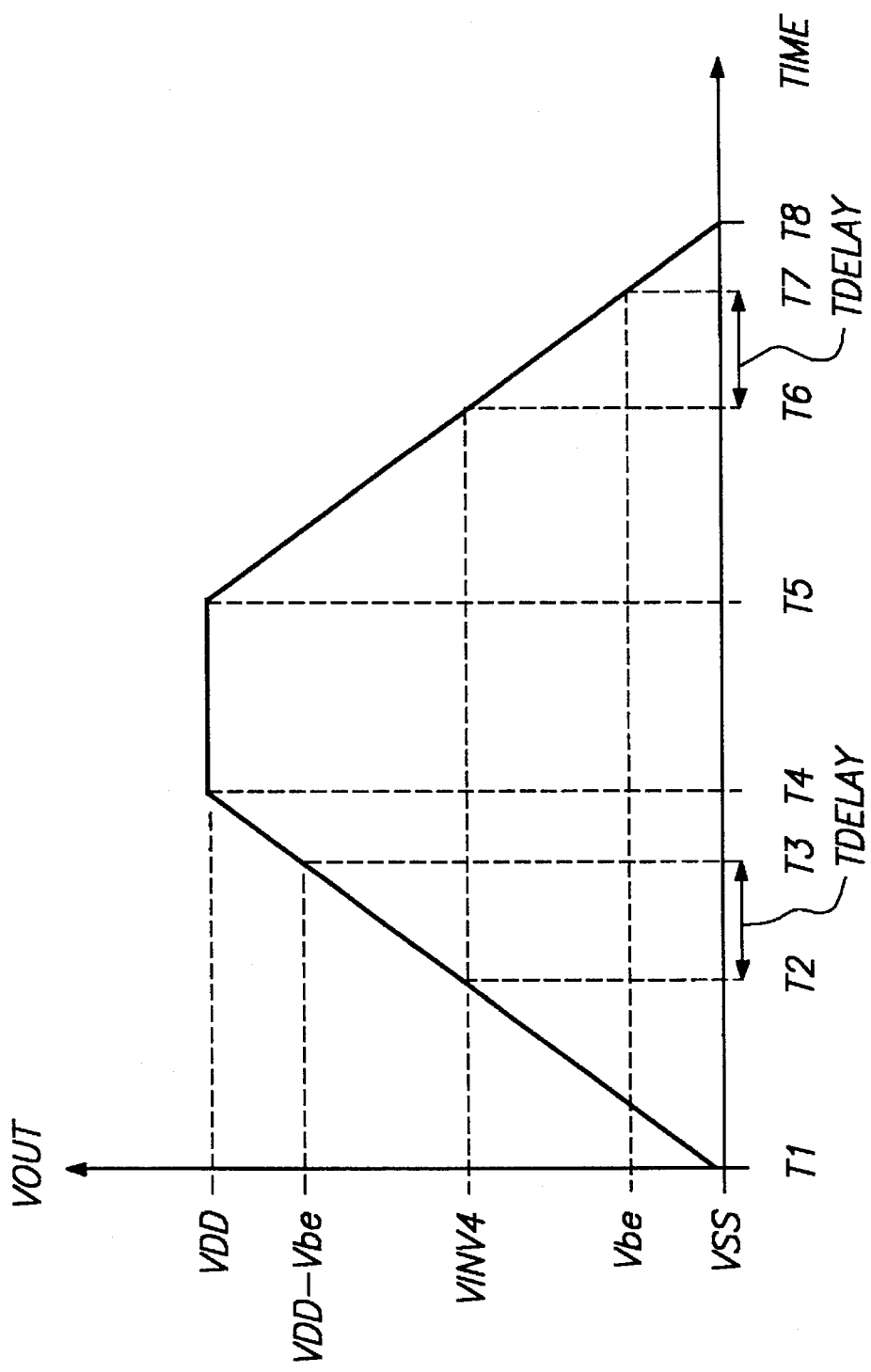
FIG. 3 illustrates the output voltage characteristic of the embodiment of the present invention shown in FIG. 2 with respect to time.

Referring to FIG. 3, at time T1, before OUT begins to transition high, IN is high, EN/ is low and OUT is low. In this state the output of NAND2 is high, since one of its inputs is high and the other is low. Further, since EN/ is low, and the output of NAND2 is high, the output of NOR3 is low. Consequently, a voltage corresponding to a high logic level is coupled to the gate of device P7 such that P7 is off.

Next, the voltage at OUT, $V_{OUT}$, increases until it reaches a voltage corresponding to the trip point of INV4, $V_{INV4}$, at time T2 (FIG. 3). When this occurs, the output of INV4 transitions high-to-low and the output of INV3 transitions low-to-high. This causes NAND2 to output a low and NOR3 to output a high such that a voltage corresponding to a low logic state is applied to the gate of P7 and P7 is now on. P7 turns on at about the time $V_{OUT}$ reaches a voltage equal to VDD–Vbe, T3 (FIG. 3). As shown in FIG. 3, with P7 on, OUT is pulled up to VDD at time T4. Inverters INV3 and INV4 provide a delay (tdelay in FIG. 3) in the feedback loop such that P7 turns on a period of time after INV4 initially changes state. Referring to FIG. 3, P7 turns on at time T3. In this way, PMOS devices P1–P4 control the slew rate of $V_{OUT}$ between T1 and T3, until it reaches approximately VDD–Vbe, wherein at this point P7 drives $V_{OUT}$ to VDD between times T3 and T4.

Due to capacitive coupling between the collector and base of Q2, when $V_{OUT}$ (and the collector of Q2) transitions high it is possible that the base of Q2 may also go high and Q2 would turn on. If this occurs, both Q1 and Q2 would be on and VDD would be shorted to VSS. In order to avoid this condition, NMOS device, N11, is coupled between the base of Q2 and VSS. The gate of N11 is coupled to the PU drive line such that when PU is driven high, N11 turns on and pulls the base of Q2 to VSS. This ensures that Q2 remains off when the pull-down portion is driving OUT high.

To enable the pull-down portion of the buffer of the present invention and cause OUT to transition high-to-low, IN is set low and EN/ is set low. In this state, the output of NOR1 begins to transition high. The output of NOR1 is coupled to the gate of N3. N3 begins to conduct when its gate voltage reaches a voltage greater than N3's threshold voltage (VT). Since OUT is initially high, when N3 begins to conduct, OUT begins to be pulled to VSS.

The output voltage of NOR1 continues to increase until it reaches a voltage equal to the threshold voltage of device N4 plus a base emitter voltage (Vbe), i.e. $VT_N$+Vbe, where $VT_N$ is the threshold voltage for an n-channel device. When this occurs, N4 turns on. This creates a path between OUT and the base of Q2 which includes NMOS drive devices N5–N8. As a result, at least one of N5–N8 begin to provide current drive to the PD drive line. As with the pull-up drive devices, the amount of drive supplied by N5–N8 is determined by the current select control signal. The current select control signal enables a portion or all of the NMOS drive devices depending on the amount of desired current drive. Thus, either all or a portion of N5–N8 will be on when N3 and N4 are enabled while Q2 drives OUT towards VSS.

It should be noted that in many prior art bipolar pull-down buffer stages, the base of the bipolar device is driven by a current source, such as a resistive load coupled to a power supply. However, this arrangement dissipates power and also requires schottky clamps on the pull-down bipolar transistor to avoid saturation. The present invention, on the other hand, drives the base of Q2 with current supplied by drive circuitry powered by capacitive charge fed back from OUT. This charge originates from the charge stored on the input(s) of the external device(s) coupled to OUT. For example, if a DRAM is coupled to OUT, the input capacitance of the DRAM is charged to a high logic level. When IN transitions high-to-low, OUT is initially high and is coupled to the drains of devices N3 and N4. As a result, N3 and N4 conduct and along with devices N5–N8 provide drive to the base of Q2. Thus, the present invention's pull-down portion is primarily powered by the stored charged from the OUT node, making the present invention's buffer a more power efficient design when compared to prior art designs that dissipate power to drive the pull-down portion of the buffer.

Current drive devices N5–N8 are able to drive OUT towards VSS until OUT reaches a voltage equal to Vbe. When this occurs devices N3 and N4 turn off. To drive OUT all the way to VSS, a feedback loop including INV3, INV4, NOR2 and N2 is employed. N2 functions in the same manner as device P7. Specifically, when N2 is enabled it couples OUT directly to VSS.

Referring to FIG. 3, at time T5, before OUT begins to transition low, IN is set low, EN/ is set low and OUT is at a voltage equal to VDD. In this state, since both inputs of NOR1 are low, its output is high. Further, since the output of NOR1 is coupled to the input of NOR2 through inverter INV10, one of NOR2's inputs is low. The other of NOR2's inputs is coupled to OUT through inverters INV4 and INV3. Since OUT is initially high, NOR2's other input is also high and thus NOR2's output is low. Consequently, a voltage corresponding to a low logic level is coupled to the gate of device N2 such that N2 is initially off.

Between times T5 and T7, the output of NOR1 increases and drives the gates of N3 and N4, which subsequently causes devices N5–N8 to be enabled. When this occurs OUT is driven from VDD towards VSS having a slew rate controlled by the amount of current drive supplied by devices N5–N8. At time T6 OUT reaches the trip point of INV4. After a delay time, tdelay, the other input of NOR2 is driven low such that NOR2's output goes high and device N2 turns on, (T7 FIG. 3). With device N2 enabled, OUT is pulled to VSS. Thus, during times T5–T7 devices N5–N8 drive OUT such that OUT has a controlled slew rate determined by the amount of current drive supplied by N5–N8 times the gain of Q2. As OUT approaches VSS, the collector of Q2 reaches a voltage such that Q2 is biased off, (at T7). After T7, Q2 is off and N2 is activated and drives OUT all the way to VSS.

When OUT transitions high-to-low, the voltage on the emitter of Q1 also decreases. If the base of Q1 is floating, it could float high and Q1 could turn on resulting in a VDD to VSS short. To safeguard against this occurrence, device N1 is coupled between the base of Q1 and VSS. N1 is enabled when the output of NOR1 is high, which occurs only when the pull-down portion is enabled and is driving OUT low, i.e. EN/ is low and IN is low. With N1 enabled, Q1's base is pulled to ground.

PMOS device P6 and NMOS devices N12 and N9 are utilized when the buffer of the present invention is disabled, i.e. EN/ is high. When the buffer is disabled the output pin may still be transitioning high and low due to other devices coupled to the I/O pin, (FIG. 1). Due to these transitions on OUT, certain well known problems arise. For instance, in the case of pull-down transistor Q2, it is necessary to ensure that, when the collector of Q2 is driven high, the base of Q2 does not follow, (due to Miller-type capacitive coupling), causing Q2 to turn on. Device N9 performs the function of driving the base of Q2 to VSS when the buffer is disabled. Specifically, with EN/ high, the output of NOR1 is low no matter what IN is. The output of NOR1 is coupled to INV5 such that the output of INV5 is high. Thus, a high voltage potential is coupled to the gate of N9 and it is enabled. Device N9 drives the base of Q2 to ground to ensure that it remains off. Driving the base of Q2 to ground ensures that no charge is capacitively coupled to Q2's base when its collector goes high and thus ensures that Q2 remains off.

Devices P6 and N12 along with INV1 function as a transmission gate that ties Q1's base and emitter together in the situation in which the buffer is disabled (i.e. EN/ high) and the voltage on OUT is transitioning high or low due to subsequent logic stage transitions. In particular, P6 protects against Q1's base-emitter junction from becoming reverse biased when OUT transitions high and N12 ensures that Q1 remains off when the buffer is disabled by ensuring that the base-emitter of Q1 does not become forward biased.

Referring to FIG. 2, the gate of N12 is coupled to EN/ and the gate of P6 is coupled to the inverse of EN/. When the buffer is disabled, EN/ is at a voltage corresponding to a high logic level (i.e. VDD(CMOS) for the embodiment shown in FIG. 2). With EN/ high, the gate of N12 is at a voltage equal to VDD(CMOS) and the gate of P6 is at a voltage equal to VSS, i.e. 0.00 volts. The sources of both P6 and N12 are coupled to OUT. In this configuration, when OUT<VDD(CMOS)–VT$_N$ then N12 is enabled and the base of Q1 is shorted to Q1's emitter to avoid a forward bias condition. On the other hand, if OUT>VSS+VT$_P$, then P6 is enabled and the base and emitter of Q1 are coupled together (where VT$_P$ is the threshold voltage of a p-channel device). Tying the base and emitter of Q1 together in this situation ensures that a large reverse bias voltage cannot develop across Q1's base emitter junction.

Finally, device N10 provides a type of temperature and VDD compensation for the current drive portion of the pull-down circuit. N10 has its gate coupled to VDD. As a result it is always on. When temperature decreases or VDD increases, current drive devices N5–N8 produce more current drive. However, when temperature decreases or VDD increases, device N10 also conducts more current. As a result, the additional unwanted current generated from devices N5–N8 due to the temperature decrease is channeled through N10.

Similarly, when the temperature increases or VDD decreases, N5–N8 produce less current drive as does device N10. As a result, less current is channeled through device N10.

Another form of temperature compensation results from the inverse relationship between the temperature coefficient (T$_c$) of the drive transistors' (N5–N8) drain-to-source current (I$_{DS}$) and the T$_c$ of Q2's H$_{FE}$. The temperature coefficient for the drain-to-source current of an MOS device is T$_c$(I$_{DS}$)≈–0.6% per °C. The temperature coefficient of the H$_{FE}$ of a bipolar device on the other hand is T$_c$(H$_{FE}$)≈0.6% per °C., the inverse of T$_{c(IDS)}$). The effect of the inverse relationship between T$_c$(H$_{FE}$) and T$_c$(I$_{DS}$) is that as temperature increases, the amount of base current drive supplied by N5–N8 decreases, while the gain (H$_{FE}$) of Q2 proportionally increases. Thus, although less current is being supplied by N5–N8, Q2 is providing increased amplification such that Q2's output current drive is unaffected by the decrease in its base current drive. Similarly, if the temperature decreases, N5–N8 supply more base current drive while the gain of Q2 proportionally decreases. In this case, although the base current drive is increased, Q2 is providing less amplification and thus the output current drive of Q2 is relatively unaffected.

Figure 4:
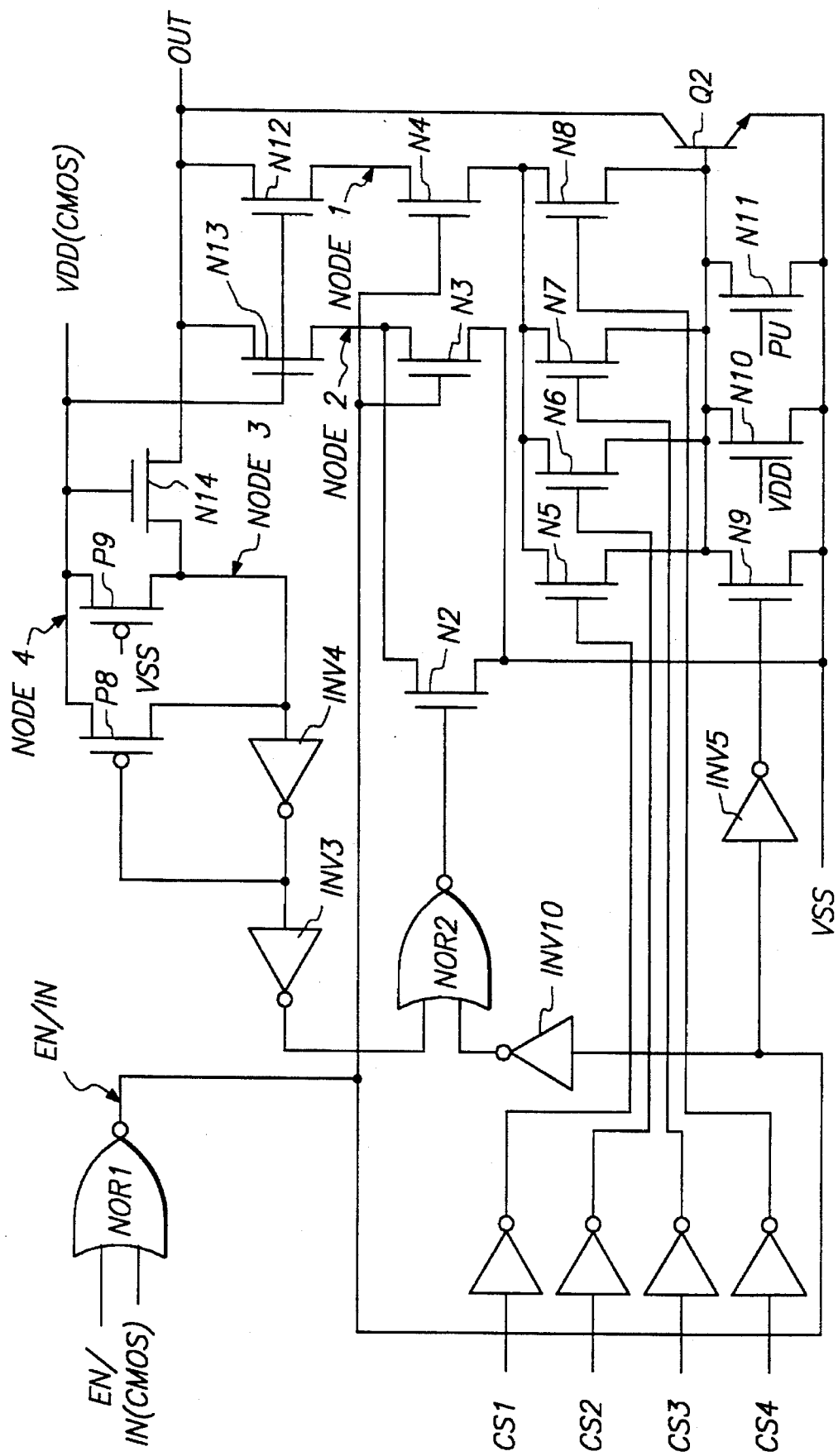
FIG. 4 illustrates the circuit schematic of the pull-down portion of a second embodiment of the buffer of the present invention having a 5 volt peak-to-peak voltage swing.
Figure 5:
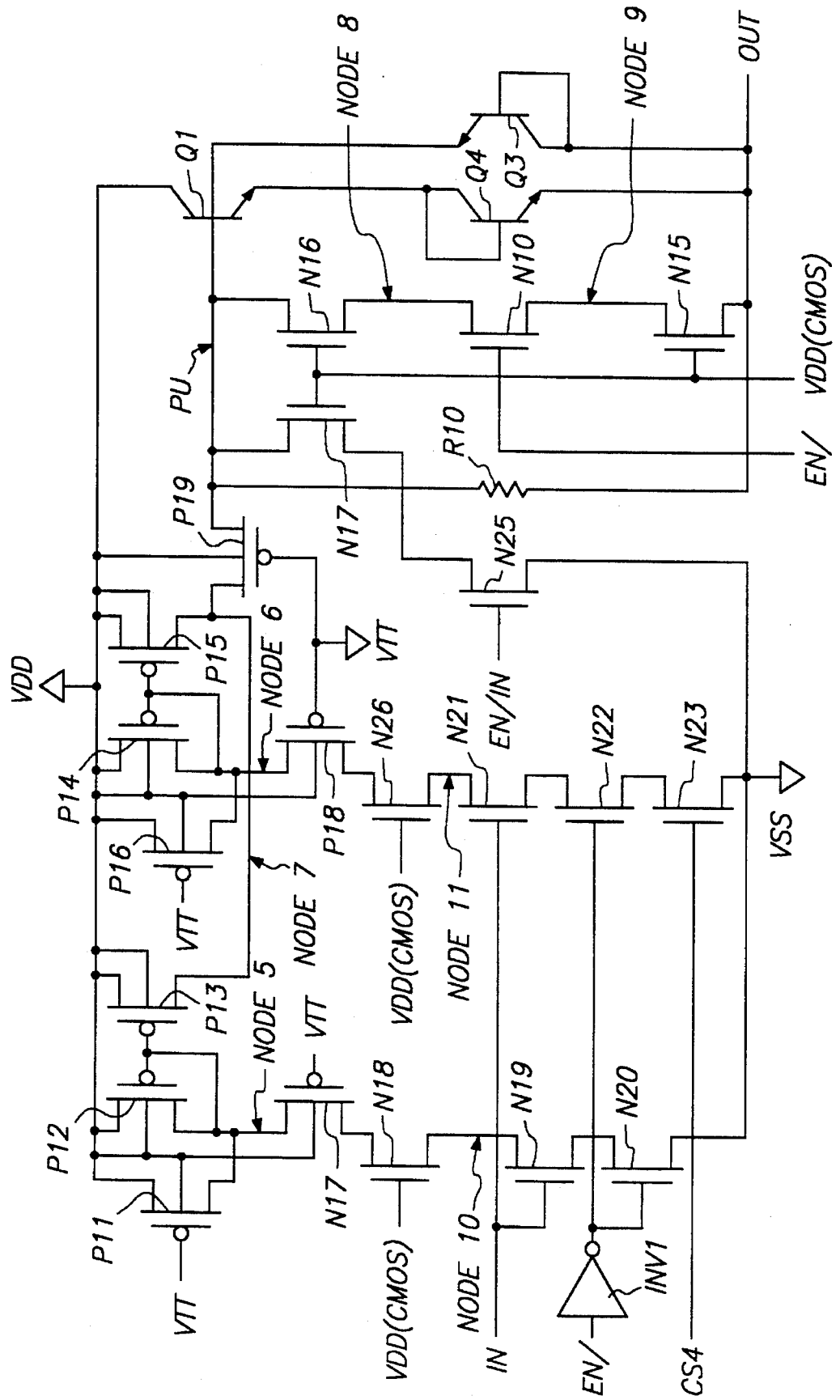
FIG. 5 illustrates the circuit schematic of the pull-up portion of a second embodiment of the buffer of the present invention having a 5 volt peak-to-peak voltage swing.

The embodiment of the buffer shown in FIG. 2 utilizes MOS devices that are fabricated to operate with voltages no more than 3.30 volts±0.30 volts. By utilizing a 3.30 volts power supply and devices, the buffer of the present invention consumes less power than prior art buffers that utilize 5.00 volt power supply MOS devices. Further, the embodiment of the buffer shown in FIG. 2 is designed to interface with other input and output logic that also utilizes 3.30 volts power supplies. As such, it is assumed that OUT never exceeds voltages higher than 3.30 volts±0.30 volts. However, in the present state of the art, the majority of logic types utilize 5.00 volt power supplies. To interface with 5.00 volt power supply logic the embodiment of the buffer of the present invention shown in FIG. 2 needs to be modified as shown in FIGS. 4 and 5. Specifically, it is necessary to ensure that specific junction voltages in the 3.30 volt MOS devices do not exceed 3.60 volts.

Recognize, that although the embodiments shown in FIGS. 2, 4, and 5 are all directed towards specific device processes and voltage supply conditions, the main elements to the controlled slew rate design of the present invention still apply, no matter what process or power supply is utilized.

FIGS. 4 and 5 show the embodiment of the buffer of the present invention that is designed to interface with logic that utilizes 5.00 volt power supplies and is implemented with MOS devices that are fabricated to operate with voltages no more than 3.30 volts±0.30 volts. FIG. 4 illustrates the pull-down portion of the 5.00 volt logic compatible buffer of the present invention and FIG. 5 illustrates the pull-up portion of the 5.00 volt logic compatible buffer of the present invention. It should be noted that in both FIGS. 4 and 5, VDD=5.00 volts, VDD(CMOS)=3.30 volts, and VTT= 2.00 volts. By operating the majority of the buffer logic at voltage potentials equal to VDD(CMOS)=3.30 volts, the embodiment of the buffer shown in FIGS. 4 and 5 are also extremely power efficient designs.

Referring to the pull-down portion in FIG. 4, Q2 is driven by devices N5–N8 when N3 and N4 are enabled. N3 and N4 are enabled in a similar manner as described in the previous embodiment. Specifically, as EN/IN increases, N3 first turns on, and then N4 is enabled once the voltage on its gate is equal to a VT+Vbe. Once, N3 and N4 are on, N5–N8 provide current drive to the base of Q2 depending on the current select control signal. As OUT transitions high-to-low, INV3 and INV4 and NOR2 provide a delayed enable signal to N2. When OUT reaches a voltage approximately equal to 0.70 volts, N2 turns on and drives OUT to VSS (GND). Devices N9 and N10 couple the base of Q2 to VSS to ensure that it does not turn on at inappropriate times in the same manner as described for the FIG. 2 embodiment.

In order to avoid the condition in which the collector and base of Q2 become capacitively coupled when V$_{OUT}$ is transitioning high and the pull-down portion is disabled and the pull-up portion is enabled, NMOS device, N11, is coupled between the base of Q2 and VSS. The gate of N11 is coupled to the PU drive line such that when PU (FIG. 5) is driven high, N11 turns on and pulls the base of Q2 to VSS. This ensures that Q2 remains off when the pull-up portion is driving OUT high.

Devices N12–N14, P8, and P9 provide protection from voltages greater than 3.30 volts occurring on OUT when the embodiment of the pull-down portion shown in FIG. 4 is interfacing with 5.00 volt power supply logic. Referring to FIG. 4, the source of NMOS device N12 is coupled to the drain (node 1) of device N4. The gate of N12 is coupled to node 4 which is held at a reference voltage VDD(CMOS), i.e. 3.30 volts. N12's drain is coupled to OUT. OUT is coupled to a subsequent logic stage or an external device that utilizes voltages that exceed 3.30 volts—typically voltages equaling 5.00 volts±10% maximum. Thus, the voltage on the drain of N12 could reach voltages of approximately 5.50 volts. Although N12's drain can reach voltages equal to 5.00 volts, tying the gate of N12 to 3.30 volts ensures that N12's source voltage (node 1) is held at $\leq$CMOS(VDD)–$VT_N$. As a result, the drain of N4 is also clamped at less than 3.30 volts and the Vgs of N4 cannot exceed 3.30 volts. In addition, the gate-to-substrate voltage is held to a voltage less than the CMOS(VDD). In a similar manner, device N13 provides protection to device N3 by clamping node 2 to CMOS(VDD)–$VT_N$. Device N14 clamps the input of inverter 1 (node 3) to a voltage of less than CMOS(VDD)–$VT_N$.

FIG. 5 shows the embodiment of the pull-up portion adapted to interface with voltages greater than 3.30 volts. A first current mirror, consisting of devices P12 and P13, provide a first current drive and a second current mirror device, consisting of devices P14 and P15, provide a second current drive. In the preferred embodiment the first and second current drives are equal. The first and second current mirrors function such that when a current is established in the device coupled as a diode, it is reflected through to the other device. For example, P12 is coupled as a diode having its gate coupled to its drain (FIG. 5). P12's source functions as the anode and its drain/gate functions as the cathode. When P12's source/gate (node 5) is pulled low, the diode is forward biased and a current is established though P12. The current through P12 further establishes a Vgs voltage in P13. As a result, the current flowing through P12 is reflected through to P13. The drain of P13 is coupled to the PU drive line, through P19. Since P19 is always on, the current from P13 drives the PU line.

Similarly, when node 6 is pulled low, the diode formed by device P14 is forward biased and conducts current. The current established in P14 is reflected through to P15 and coupled to the PU drive line through device P19. In the preferred embodiment, each current mirror provides the same amount of current drive. Thus, when the first current mirror is enabled, a first current drive is supplied and when the first and second current mirrors are enabled, the current drive to the PU line is doubled.

The voltage level on nodes 5 and 6 is controlled by N19–N23 and P11 and P16. When EN/ is high (i.e. the buffer is disabled) both N20 and N22 are off and P11 and P16 are on. In this state, node 5 is held at a voltage equal to VDD by device P11 and node 6 is held at VDD by device P16. Note, devices N18 and N26 provide protection to the drains of devices N19 and N21 (nodes 10 and 11 respectively) against voltages exceeding 3.30 volts.

To enable only one current mirror, EN/ is low, IN is high (i.e. the buffer is enabled and driving OUT high) and CS4 is low. In this state, N19–N22 are on, and N23 is off. Consequently, node 5 is pulled to VTT+$VT_P$ and node 6 is still at a potential equal to VDD. With node 5 low and node 6 high, the first current mirror (P12 and P13) is enabled and the second current mirror is disabled. Consequently a first current drive is coupled to the PU line. Note that P17 protects P11, P12 and P13 from gate-to-source, gate-to-drain, and drain-to-source voltages greater than VDD–$VT_P$–VTT. Similarly, P18 protects P16, P14, and P15 from gate-to-source, gate-to-drain, and drain-to-source voltages greater than VDD–$VT_P$–VTT.

To enable both current mirrors, EN/ is set low and IN is set high, and CS4 is set high. With CS4 high, N19–23 are enabled and nodes 5 and 6 are both pulled to VTT+$VT_P$. As a result both the first and second current mirrors are enabled. The two current mirrors then simultaneously drive the PU drive line.

It should be noted that devices P11 couples the drain of P12 to VDD in the case when node 5 is not being pulled low by devices N19–N21 and P16 couples the drain of P14 to VDD when node 6 is not being pulled low by devices N19–N21. In this way the current mirrors are held off when the pull-up portion is disabled. In other words, coupling the drain of P12 to VDD ensures that a voltage is not developed across P12 and consequently a current is not developed through P13 when node 5 is not being pulled low. Similarly, coupling the drain of P16 to VDD ensures that a voltage is not developed across P14 and consequently a current is not developed through P15 and when node 6 is not being pulled low.

P19 functions to protect the sources of devices P13 and P15 since the PU drive line can reach voltages exceeding 3.30 volts. As can be seen, the gate of P19 is coupled to VTT. VTT is a reference voltage equal to 2.00 volts. Having the gate of P19 clamped to a voltage of 2.00 volts ensures that node 7 also does not fall below 2.00 volts+$VT_P$.

N10 (FIG. 5) ensures that Q1 does not conduct when the buffer is disabled (i.e. EN/=1) and OUT is being driven low by external logic. When the EN/=1, N10 is on and holds Q1 off by tying its base-emitter junction together.

N15 and N16 function to protect the source and drain of N10 respectively. This protection is needed since OUT and the PU drive line can reach voltages exceeding 3.30 volts. Nodes 8 and 9 are clamped to voltages approximately equal to a $VT_N$ (threshold voltage for an n-channel MOS device) below the gate voltages of N15 and N16—approximately 2.70 volts.

N25 ensures that Q1 remains off when the buffer is enabled but the pull-up portion is disabled and the pull-down portion is driving OUT low, (i.e. EN/=0 and IN=0). In this state, the output of NOR1 (EN/IN) is high (refer to FIG. 4). As shown in FIG. 5, the EN/IN signal is coupled to the gate of N25. Consequently when EN/IN is high, N25 is on and pulls the base of Q1 to VSS (i.e. GND). Thus, N25 ensures that the pull-up portion remains off when the pull-down portion is driving OUT low. Protection device N17 functions to protect the drain of N25 from voltages exceeding 3.30 volts seen on the PU drive line.

NPN Transistor Q3 is coupled as a diode across the base-emitter junction of Q1 to prevent large reverse bias voltages from occurring across the base-emitter junction of Q1 and Q4 when the buffer is disabled. Specifically, when the buffer is disabled, OUT is tri-stated. Since the base of Q1 is coupled to OUT through R10, the base is also pulled to a voltage approximately equal to OUT(DC) (where OUT(DC) is the DC output voltage measured on OUT). However, since the base is being pulled towards VDD through R10, it tends to approach VDD at a slower rate than the emitter (due to the RC time constant associated with the base). Thus, when OUT goes high, Q3's diode junction is forward biased, and Q3 ensures that no more than a diode drop is developed across the base-emitter junctions of Q3 and Q4 as they approach VDD.

Q4 (FIG. 5) functions to set the proper logic level for a TTL compatible signal. In the field of logic design, a standard specification for a TTL high logic level voltage is approximately equal to a VDD–2Vbe. So when the pull-up portion is driving OUT high, Q4 is on and a voltage equal to VDD–2Vbe is seen on OUT, (note: OUT may approach VDD for slow waveforms and light DC loads).

The embodiments of the buffer of the present invention shown in FIGS. 2, 4 and 5 include both pull-up and a pull-down portions to provide the flexibility of controlling the slew rate of an output signal when it is transitioning high-to-low or low-to-high. In some applications, only a high-to-low transition controlled slew rate signal is required. In this case, only the pull-down portion of the present invention is necessary.

Figure 6:
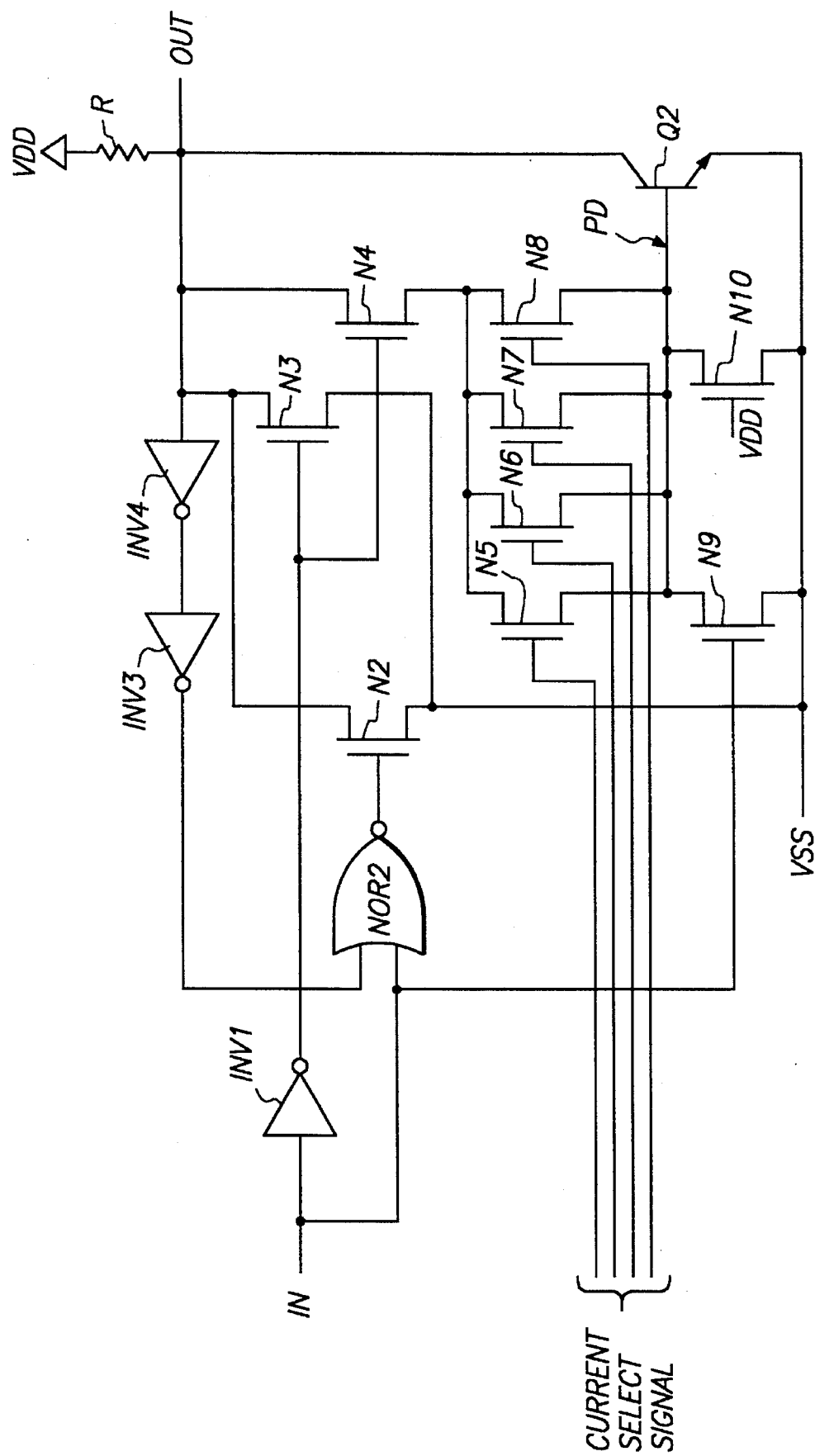
FIG. 6 illustrates an embodiment of the buffer of the present invention having only a controlled slew rate pull-down portion.

FIG. 6 illustrates an embodiment of the present invention that provides a controlled slew rate high-to-low signal with a controlled slew rate pull-down portion and includes a passive resistor for the pull-up portion. It should be obvious to one of ordinary skill in the art that an active pull-up (without slew control) may also be substituted for the passive resistor. The buffer in FIG. 6 functions such that when IN is low, the buffer drives OUT from a high logic level voltage to a low logic level voltage with a controlled slew rate determined by the Current Select Signal. When IN is high, the resistor pulls the output to a high logic level voltage.

Referring to FIG. 6, devices N5–N8 provide the digitally controllable current drive to the base of pull-down bipolar device Q2. Devices N3 and N4 are enabled when the output of INV1 has reached a voltage equal to $VT_{(N)}$+ Vbe, where $VT_{(N)}$ is the threshold voltage of an NMOS device. Once N3 and N4 are enabled, N5–N8 provide drive to Q2. Further, as described above in conjunction with FIGS. 2 and 4, logic gates INV3, INV4 arid NOR2 provide a delayed signal to the gate of N2 so that when OUT reaches 0.70 volts, N2 is enabled and pulls OUT to VSS. Device N9 pulls the base of Q2 to ground when the output of the buffer shown in FIG. 6 is being pulled high by the passive pull-up resistor (i.e. IN is high) to ensure that Q2 remains off despite voltage fluctuations on the collector of Q2. N10 provides temperature compensation as described above.

Although the present invention has been described in conjunction with certain embodiments, it is appreciated that the invention may be implemented in a variety of other ways. By way of example, FIG. 4 and 5 include additional circuitry to protect junction voltages of certain MOS devices when interfacing with other higher voltages. However, these additional elements are not necessary to provide the controlled slew rate output signal as described by the present invention. Further, although MOS devices fabricated to operate with voltages no greater than 3.30 volt junction voltages are utilized to implement the embodiments shown it) FIGS. 2, 4, and 5, the present invention is not limited to that particular process.

In addition, although the embodiments of the present invention utilize specific power supply voltages, the present invention may be modified to operate with other power supplies. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

Thus, the present invention is an improved BiCMOS buffer having a digitally controlled slew rate output signal.

We claim:

1. A circuit for providing a digital output signal with a controlled slew rate, said digital output signal corresponding to a digital input signal, said circuit comprising:

first and second bipolar transistors coupled in series at a common output node between first and second working potentials, the collector of said first transistor being coupled to said first working potential and the emitter of said second transistor being coupled to said second working potential, said second working potential being less than said first working potential;

a first means comprising a first set of parallel MOS devices coupled between said first working potential and said base of said first bipolar transistor For providing a digitally selectable amount of current to the base of said first bipolar transistor when said digital input signal is at a first voltage level corresponding to a first logic state, said first means being coupled between said first working potential and said base of said first bipolar transistor, said first means being responsive to current select signals being coupled to the gates of said first set of parallel MOS devices wherein said current select signals determines said amount of current provided by said first means;

a second means comprising a second set of parallel MOS devices coupled between said common output node and said base of said second bipolar transistor for providing a digitally selectable amount of current to the base of said second bipolar transistor when said digital input signal is at a second voltage level corresponding to a second logic state, said second means being coupled between said common output node and said base of said second bipolar transistor, said second means being responsive to said current select signals coupled to the gates of said second set of parallel MOS devices wherein said current select signals determines said amount of current provided by said second means.

2. The circuit as described in claim 1 wherein said second means for providing said digitally selectable amount of current is driven by stored charge from said common output node.

3. The circuit described in claim 2 further including a first feed back circuit coupled between said common output node and said second working potential, said first feedback circuit coupling said common output node to said second working potential when said digital output signal is transitioning high-to-low and reaches a voltage approximately equal to 0.70 volts.

4. The circuit described in claim 3 further including a second feed back circuit coupled between said common output node and said first working potential, said second feedback circuit coupling said common output node to said first working potential when said digital output signal is transitioning low-to-high and reaches a voltage equal to approximately one diode drop less than said first working potential.

5. The circuit described in claim 3 wherein said first feedback circuit includes a first means for providing a delayed digital output signal to a first means for driving said common output node to said second working potential, wherein when said common output node reaches a voltage equal to approximately 0.70 volts, said first means for driving said common output node to said second working potential is enabled by said first means for providing said delayed digital output signal.

6. The circuit described in claim 4 wherein said second feedback circuit includes a second means for providing said delayed digital output signal to a second means for driving said common output node to said first working potential, wherein when said common output node reaches a voltage equal to approximately one diode drop less than said first working potential, said second means for driving said common output node to said first working potential is enabled by said second means for providing said delayed digital output signal.

7. The circuit described in claim 4 wherein said circuit is implemented with MOS devices that are fabricated to operate with voltages less than or equal to 3.30 volts, said first working potential is approximately equal to 3.30 volts, and said second working potential is approximately equal to 0.0 volts.

8. The circuit described in claim 4 wherein said first working potential is approximately equal to 5.00 volts, said second working potential is approximately equal to 0.00 volts and said circuit is implemented with MOS devices that are fabricated to operate with voltages less than or equal to 3.30 volts, said circuit including means for preventing the gate oxide voltages of certain of said MOS devices from exceeding voltages greater than 3.30 volts.

9. A circuit for providing a digital high-to-low output signal having a controlled slew rate, said digital high-to-low output signal corresponding to a digital input signal, said circuit comprising:

a means for pulling the output of said circuit to a first working potential when said input digital signal is in a first logic state, said means being coupled between said first working potential and said output of said circuit;

a bipolar transistor having its collector coupled to said output of said circuit and having its emitter coupled to a second working potential;

a means for providing a digitally selectable amount of current when said digital input signal is in a second logic state said current providing means comprising a set of parallel MOS devices coupled between said output of said circuit and said base of said bipolar transistor, said amount of current being determined by select signal coupled to the gates of each of said set of parallel MOS devices, said means for providing said digitally selectable amount of current being coupled between said output of said circuit and the base of said bipolar transistor.

10. The circuit as described in claim 9 wherein said means for providing said digitally selectable amount of current is driven by stored charge from said output of said circuit.

11. The circuit described in claim 10 further including a feed back circuit coupled between said output of said circuit and said second working potential, said feedback circuit coupling said output of said circuit to said second working potential when said high-to-low output signal reaches a voltage approximately equal to 0.70 volts.

12. The circuit described in claim 11 wherein said feedback circuit includes a means for providing a delayed digital output signal to a means for driving said output of said circuit to said second working potential, wherein when said output of said circuit reaches a voltage equal to approximately 0.70 volts, said means for driving said output of said circuit to said second working potential is enabled by said means for providing said delayed digital output signal.

13. The circuit described in claim 12 wherein said circuit is implemented with MOS devices that are fabricated to operate with voltages less than or equal to 3.30 volts, said first working potential is approximately equal to 3.30 volts, and said second working potential is approximately equal to 0.0 volts.

14. In a digital output buffer including a bipolar pull-up transistor and a bipolar pull-down transistor coupled in series between first and second working potentials, said digital output buffer for providing a digital output signal in response to a digital input signal, wherein the slew rate of said digital output signal is dependent on an external load coupled to the output of said digital output buffer, an improvement to said digital output buffer for controlling said slew rate of said digital output signal comprising:

a first means for providing a digitally selectable current to the base of said pull-up bipolar transistor when said digital input signal is at a first voltage level corresponding to a first logic state, said first means for providing said digitally selectable current being responsive to select signals, wherein said select signals determines the amount of said digitally selectable current provided to said base of said pull-up bipolar transistor;

a second means for providing a digitally selectable current to the base of said pull-down bipolar transistor when said digital input signal is at a second voltage level corresponding to a second logic state, said second means for providing said digitally selectable current being responsive to said select signals, wherein said select signals determines the amount of said digitally selectable current provided to said base of said pull-down bipolar transistor.

15. The improvement as described in claim 14 wherein said first means for providing said digitally selectable current comprises a first set of parallel MOS devices coupled between said base and said collector of said bipolar pull-up transistor and said second means for providing said digitally selectable current comprises a second set of parallel MOS devices coupled between said base of said bipolar pull-down transistor and said output of said digital output buffer, said select signals being coupled to the gates of each of said first and second sets of said parallel MOS devices.

16. The improvement as described in claim 15 wherein said second means for providing said digitally selectable current is driven by stored charge from said output of said digital output buffer.

* * * * *